United States Patent
Wang et al.

(10) Patent No.: US 8,952,457 B2
(45) Date of Patent: Feb. 10, 2015

(54) ELECTROSTATIC DISCHARGE PROTECTION CIRCUIT

(75) Inventors: Shih-Yu Wang, Hsinchu (TW); Chia-Ling Lu, Hsinchu (TW); Yan-Yu Chen, Hsinchu (TW); Yu-Lien Liu, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 635 days.

(21) Appl. No.: 12/181,545

(22) Filed: Jul. 29, 2008

(65) Prior Publication Data
US 2009/0273033 A1 Nov. 5, 2009

(30) Foreign Application Priority Data
Apr. 30, 2008 (TW) ................................ 97115891 A

(51) Int. Cl.
*H01L 23/62* (2006.01)
*H01L 27/02* (2006.01)

(52) U.S. Cl.
CPC .................................. *H01L 27/0266* (2013.01)
USPC ............ 257/360; 257/355; 257/357; 257/409

(58) Field of Classification Search
USPC .................. 257/355, 356, 361, 362, 360, 371
See application file for complete search history.

(56) References Cited

U.S. PATENT DOCUMENTS

| | | | |
|---|---|---|---|
| 5,623,156 A * | 4/1997 | Watt | 257/355 |
| 6,355,508 B1 * | 3/2002 | Porter et al. | 438/140 |
| 6,566,715 B1 | 5/2003 | Ker et al. | |
| 6,621,133 B1 | 9/2003 | Chen et al. | |
| 6,903,913 B2 | 6/2005 | Ker et al. | |
| 6,979,869 B2 | 12/2005 | Chen et al. | |
| 7,106,568 B2 | 9/2006 | Chen | |
| 7,176,539 B2 | 2/2007 | Chen | |
| 7,582,938 B2 * | 9/2009 | Chen | 257/357 |
| 7,595,537 B2 * | 9/2009 | Kodama et al. | 257/409 |
| 8,269,280 B2 * | 9/2012 | Chen | 257/357 |
| 2003/0197246 A1 * | 10/2003 | Ker et al. | 257/565 |
| 2006/0033163 A1 * | 2/2006 | Chen | 257/355 |

FOREIGN PATENT DOCUMENTS

TW 548824 8/2003

* cited by examiner

*Primary Examiner* — Steven Loke
*Assistant Examiner* — David Goodwin
(74) *Attorney, Agent, or Firm* — J.C. Patents

(57) ABSTRACT

An ESD protection circuit including a substrate of a first conductivity type, an annular well region of a second conductivity type, two first regions of the first conductivity type and at least one transistor of the second conductivity type is provided. The annular well region is disposed in the substrate. The first regions are disposed in the substrate and surrounded by the annular well region. The at least one transistor is disposed on the substrate between the first regions and including a source, a gate, and a drain. The annular well region and the drain are coupled to a first voltage source. The source and one of the first regions are coupled to a second voltage source, and the other of the first regions is coupled to a substrate triggering circuit.

16 Claims, 7 Drawing Sheets

ELECTROSTATIC DISCHARGE PROTECTION CIRCUIT

CROSS-REFERENCE TO RELATED APPLICATION

This application claims the priority benefit of Taiwan application serial no. 97115891, filed Apr. 30, 2008. The entirety of the above-mentioned patent application is hereby incorporated by reference herein and made a part of this specification.

BACKGROUND OF THE INVENTION

1. Field of the Invention

The present invention generally relates to an integrated circuit, and more particularly to an electrostatic discharge (ESD) protection circuit.

2. Description of Related Art

ESD is a phenomenon of a sudden transfer of electrostatic charge between bodies at different electrostatic potentials. Semiconductor devices and circuits in ICs can be damaged by ESD. For example, a charge carrying object, such as a human body walking on a carpet, a machine for packaging ICs or an apparatus for testing ICs, can discharge to the IC chip when they are in contact with each other. Thus, the IC chip is damaged or broken by the transient power of ESD.

To protect the IC chip from being damaged by ESD, an ESD protection device is added to the IC design. Generally, there are many kinds of designs for ESD protection devices. A typical one is a transistor layout with a metal-oxide-semiconductor (MOS) transistor to achieve the purpose of ESD protection, in which an ESD current can be released by turning on a parasitic bipolar junction transistor generated below the MOS transistor. Further, a substrate bias is increased by applying a substrate triggering technology.

In designing the layout for such an ESD protection device, since resistance is proportional to voltage, a well, a shallow trench isolation (STI), or a field oxide (FOX) are often disposed to increase the substrate resistance, so that the substrate bias is increased accordingly, and the ESD protection ability is improved. However, the above-mentioned method also causes an unstable substrate voltage for the ESD protection device in normal operation, so that the operation performance of the ESD protection device is affected. Further, when the ESD current occurs, the ESD protection ability is affected as a consequence of the incomplete turning on if the layout is not designed or arranged appropriately.

Accordingly, it has become an important topic in the industry about how to design an appropriate ESD protection circuit without disturbing the normal operation of the device.

SUMMARY OF THE INVENTION

The present invention provided an ESD protection circuit, in which the substrate current is increased so that the substrate bias is increased, the conventional incomplete turning on of the ESD protection circuit is avoided and the ESD protection ability is improved.

The present invention provides an ESD protection circuit. The ESD protection circuit includes a substrate of a first conductivity type, an annular well region of a second conductivity type, two first regions of the first conductivity type and at least one transistor of the second conductivity type. The annular well region is disposed in the substrate. The two first regions are disposed in the substrate and surrounded by the annular well region. The at least one transistor is disposed on the substrate between the two first regions.

According to an embodiment of the present invention, the at least one transistor comprises bipolar junction transistor or field transistor.

According to an embodiment of the present invention, the at least one transistor comprises metal-oxide-semiconductor transistor of the second conductivity type comprising a source, a gate, and a drain.

According to an embodiment of the present invention, the annular well region and the drain are coupled to a first voltage source. The source and one of the first regions are coupled to a second voltage source, and the other of the first regions is coupled to a substrate triggering circuit.

According to an embodiment of the present invention, the drain forms a diode with the first region coupled to the second voltage source, and the annular well region forms another diode with the first region coupled to the second voltage source.

According to an embodiment of the present invention, the drain, the substrate, and the source form a parasitic bipolar junction transistor.

According to an embodiment of the present invention, the first conductivity type is P-type, and the second conductivity type is N-type.

According to an embodiment of the present invention, the first conductivity type is N-type, and the second conductivity type is P-type.

According to an embodiment of the present invention, the ESD protection circuit further includes an isolation structure, disposed between the annular well region and each of the first regions, and between each of the first regions and the transistor. The isolation structure may be a STI structure or a FOX structure, for example.

According to an embodiment of the present invention, the ESD protection circuit further includes a second region of the first conductivity type. The second region is disposed in the substrate at an outside of the annular well region.

According to an embodiment of the present invention, the second region and the annular well region form a diode.

The present invention also provides an ESD protection circuit. The ESD protection circuit includes a substrate of a first conductivity type, an annular well region of a second conductivity type, two first regions of the first conductivity type, at least one second region of the first conductivity type and at least two transistors. The annular well region is disposed in the substrate. The two first regions are disposed in the substrate and surrounded by the annular well region. The at least one second region is disposed between the two first regions. The at least two transistors are disposed on the substrate respectively between the second region and each of the first regions.

According to an embodiment of the present invention, the at least two transistors comprise bipolar junction transistors or field transistors.

According to an embodiment of the present invention, the at least two transistors comprise metal-oxide-semiconductor transistors and each of the metal-oxide-semiconductor transistors comprises a source, a gate, and a drain.

According to an embodiment of the present invention, the annular well region and the drains are coupled to a first voltage source. The two first regions and the sources are coupled to a second voltage source. The second region is coupled to a substrate triggering circuit.

According to an embodiment of the present invention, a drain, the substrate, and a source adjacent to the drain form a parasitic bipolar junction transistor.

According to an embodiment of the present invention, one of the first regions form diodes respectively with the annular well region and the adjacent drain, and the other of the first regions form diodes respectively with the annular well region and the other of the drains.

According to an embodiment of the present invention, the first conductivity type is P-type, and the second conductivity type is N-type.

According to an embodiment of the present invention, the first conductivity type is N-type, and the second conductivity type is P-type.

According to an embodiment of the present invention, the ESD protection circuit further includes an isolation structure, disposed between the annular well region and each of the two first regions, between each of the two first regions and each of the two transistors, and between the second region and each of the two transistors, for example.

According to an embodiment of the present invention, the ESD protection circuit further includes a third region of the first conductivity type. The third region is disposed in the substrate at an outside of the annular well region.

According to an embodiment of the present invention, the third region and the annular well region form a diode.

In this invention, the regions of the first conductivity type, respectively serving as an in-terminal and an out-terminal of the substrate triggering current, and the transistor of the second conductivity type are enclosed by the annular well region of the second conductivity type. In such a layout, the flow path of the substrate current is restricted by the annular well region, so that the substrate current is increased. Therefore, the substrate bias is increased accordingly, the incomplete turning on of the transistor of the ESD protector device is avoided, and the triggering voltage of the ESD protection device is reduced. Further, another region of the first conductivity type can be disposed in the substrate at the outside of the annular well region for releasing the negative electrostatic current.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to better understand the invention.

DESCRIPTION OF THE EMBODIMENTS

Figure 1A:
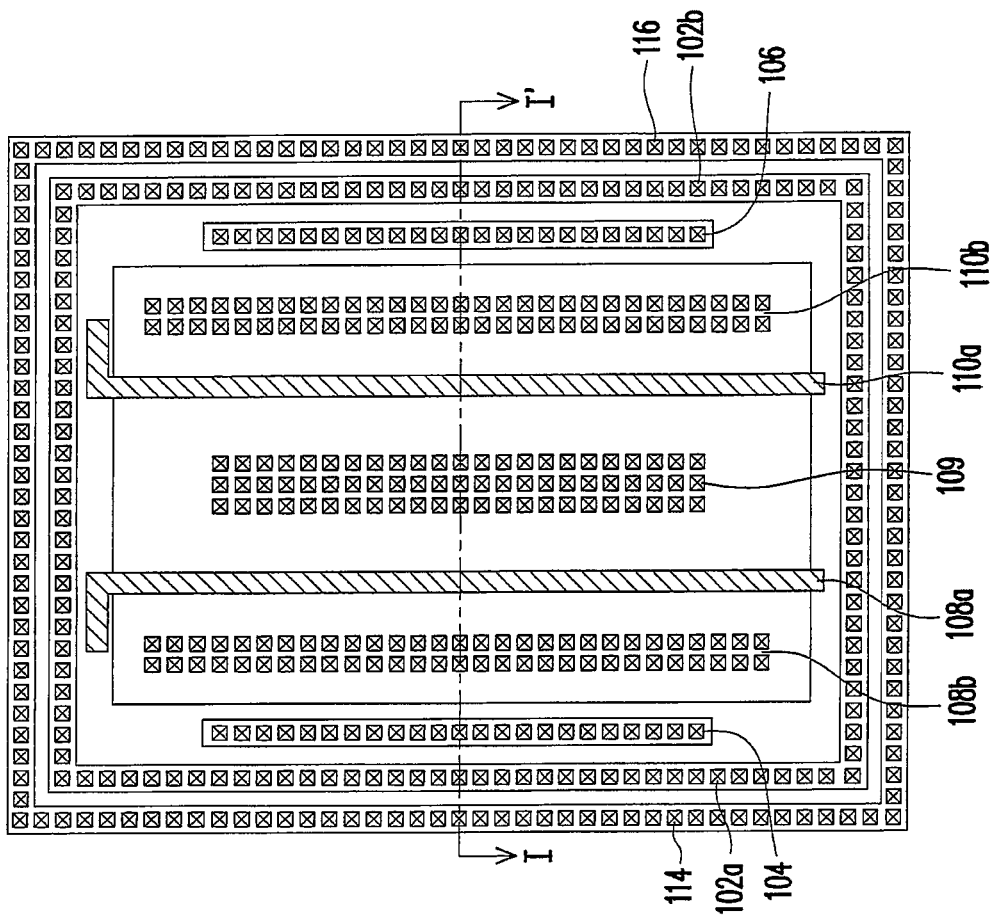
FIG. 1A is a top-view schematic diagram illustrating an ESD protection circuit according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The following embodiments in which the first conductivity type is P-type and the second conductivity type is N-type are provided for illustration purposes and are not to be construed as limiting the scope of the present invention. It is appreciated by persons skilled in the art that the first conductivity type can be N-type and the second conductivity-type can be P-type.

Figure 1B:
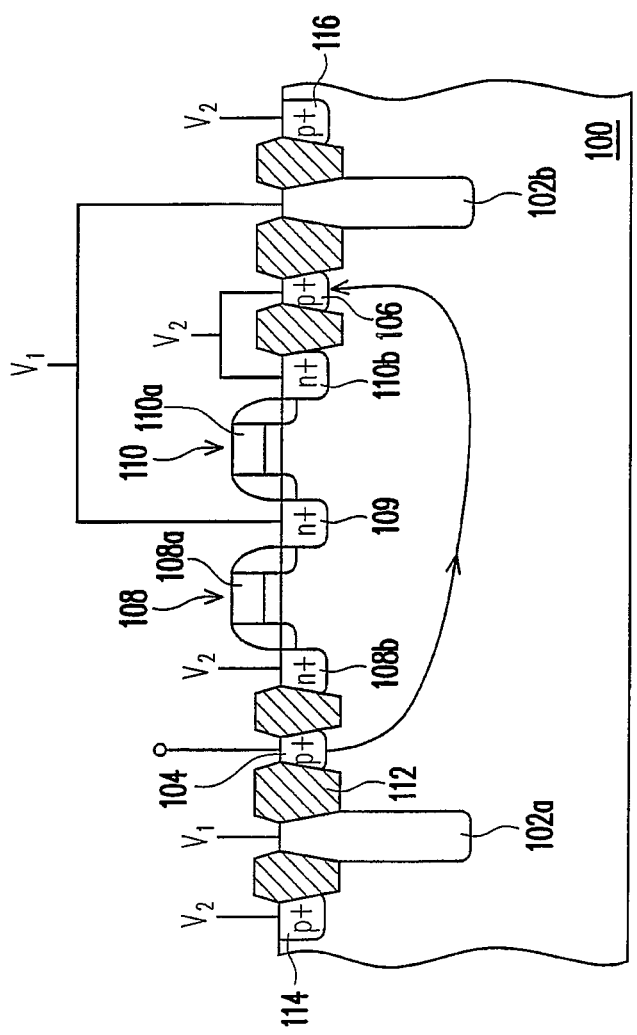
FIG. 1B is a cross-section view taken along the line I-I' of FIG. 1A.

FIG. 1A is a top-view schematic diagram illustrating an ESD protection circuit according to a first embodiment of the present invention. FIG. 1B is a cross-section view taken along the line I-I' of FIG. 1A.

Referring to FIGS. 1A and 1B, the ESD protection circuit includes a substrate 100 of the first conductivity type, annular well regions 102a and 102b of the second conductivity type, two first regions 104 and 106 of the first conductivity type, and at least one transistor. The at least one transistor includes metal-oxide-semiconductor (MOS) transistor, bipolar junction transistor (BJT) or field transistor (FT), for example. In this embodiment, two MOS transistors 108 and 110 of the second conductivity type are provided for illustration purposes and are not to be construed as limiting the scope of the present invention. The number of the MOS transistors is not limited by the present invention.

The substrate 100 is a P-type substrate, for example. The annular well regions 102a and 102b are N-type annular well regions and disposed in the substrate 100, for example. In this embodiment, the annular well regions 102a and 102b are from the same annular well region, for example.

The first regions 104 and 106 are disposed in the substrate 100 and surrounded by the annular well regions 102a and 102b. The first regions 104 and 106 are P+ regions, for example. One of the first regions 104 and 106 is coupled to a substrate triggering circuit. In this embodiment, the first region 104 is coupled to the substrate triggering circuit.

Furthermore, the MOS transistors 108 and 110 are disposed on the substrate 100 between the first regions 104 and 106. The MOS transistors 108 and 110 are N-type MOS (NMOS) transistors, for example. The MOS transistor 108 includes a gate 108a, a source 108b, and a drain 109. The MOS transistor 110 includes a gate 110a, a source 110b, and a drain 109. In this embodiment, the drain 109 serves as a common drain for the MOS transistors 108 and 110. In this embodiment, a gate dielectric layer disposed below the gate, a spacer disposed beside the gate and the gate dielectric layer, and a shallow doped region disposed below the spacer are also provided in the drawings. However, these are well known to persons skilled in the art, and thus are not to be iterated hereby.

In this embodiment, the annular well regions 102a and 102b and the drain 109 are coupled to a first voltage source ($V_1$). The sources 108b and 110b and the first region 106 are coupled to a second voltage source ($V_2$).

It is noted that in this embodiment, the ESD protection circuit further includes isolation structures 112 for avoiding the undesired electrical connection. The isolation structures 112 are disposed respectively between the MOS transistor 108 and the first region 104, between the MOS transistor 110 and the first region 106, between the first region 104 and the annular well region 102a, and between the first region 106 and the annular well region 102b. The isolation structures 112 are STI structures or FOX structures, for example.

It is also noted that the MOS transistors 108 and 110 as well as the first regions 104 and 106 are enclosed by the annular well regions 102a and 102b, and the first regions 104 and 106 are disposed around the inner sides of the annular well regions 102a and 102b. The substrate triggering current flows in the first region 104 coupled to the substrate triggering circuit, and flows out from the other first region 106 due to the restriction of the structural layout of the annular well regions 102a and 102b. Thus, the substrate triggering current is increased, the substrate bias is raised accordingly, and the incomplete turning on of the transistors of the ESD protection circuit is avoided.

In this embodiment, the ESD protection circuit further includes second regions 114 and 116 of the first conductivity type. The second regions 114 and 116 are disposed in the substrate 100 at the outside of the annular well regions 102a and 102b. The second regions 114 and 116 can be an annular region as shown in FIG. 1A. In another embodiment (not shown), the second regions 114 and 116 can be two regions disposed at the outside of the annular well regions 102a and 102b. In another embodiment (not shown), only one second region is disposed at one side of the annular well regions 102a and 102b. The second regions 114 and 116 are P+ regions, for example. The second regions 114 and 116 are coupled to the second voltage source ($V_2$). Further, the isolation structures 112 for avoiding the undesired electrical connection are disposed respectively between the annular well region 102a and the second region 114, and between the annular well region 102b and the second region 116.

Figure 2A:
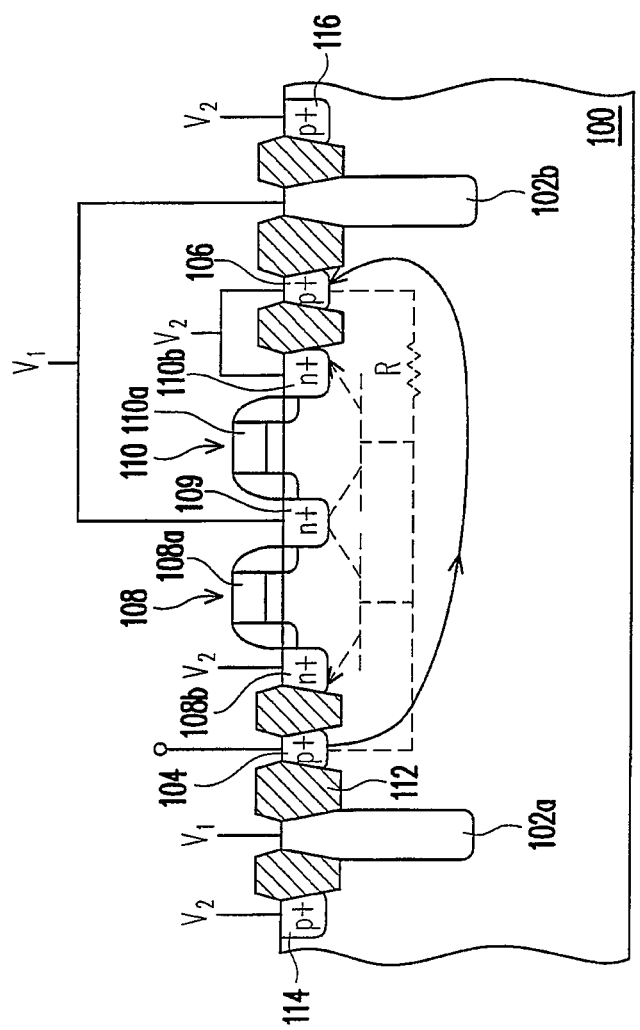
FIG. 2A schematically illustrates an ESD path when an ESD protection circuit is attacked by a positive electrostatic current according to the first embodiment of the present invention.
Figure 2B:
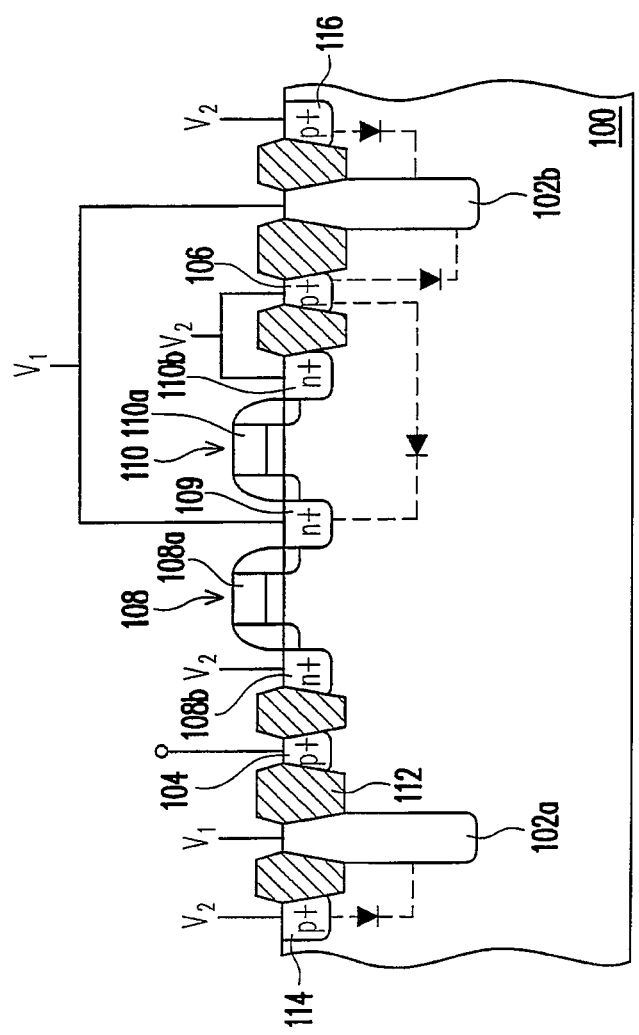
FIG. 2B schematically illustrates an ESD path when an ESD protection circuit is attacked by a negative electrostatic current according to the first embodiment of the present invention.

The operation of the ESD protection circuit will be illustrated below. FIG. 2A schematically illustrates an ESD path when an ESD protection circuit is attacked by a positive electrostatic current according to the first embodiment of the present invention. FIG. 2B schematically illustrates an ESD path when an ESD protection circuit is attacked by a negative electrostatic current according to the first embodiment of the present invention.

Referring to FIG. 2A, when the ESD protection circuit is attacked by the positive electrostatic current, the substrate triggering current flows in the first region 104a coupled to the substrate triggering circuit, so as to turn on the protection mechanism of the ESD protection circuit. In detail, the ESD protection circuit is applied a positive bias voltage; i.e. a positive voltage is applied to the first voltage source ($V_1$), and the second voltage source ($V_2$) is grounded. Two parasitic npn bipolar junction transistors are generated below the MOS transistors 108 and 110. One of the two parasitic npn bipolar junction transistors is formed by the drain 109, the substrate 100 and the source 108b, and the other is formed by the drain 109, the substrate 100, and the source 110b. R represents a resistance value of the substrate 100. The substrate triggering current flows in the first region 104 and turns on the npn bipolar junction transistors; thus, the electrostatic current is released via the two npn bipolar junction transistors, and the substrate triggering current flows out from the other first region 106.

Referring to FIG. 2B, the ESD protection circuit is applied a negative bias voltage; i.e. a negative voltage is applied to the first voltage source ($V_1$), and the second voltage source ($V_2$) is grounded, and the negative electrostatic current can then be released by two PN diodes. One of the two PN diodes is formed by the substrate 100 around the first region 106 and the drain 109, and the other is formed by the substrate 100 around the first dope region 106 and the annular well region 102b. In an embodiment, a negative ESD path further includes another two PN diodes for releasing the negative electrostatic current, one of which is formed by the substrate 100 around the second region 114 and the annular well region 102a, and the other is formed by the substrate 100 around the second region 116 and the annular well region 102b.

In brief, the parasitic bipolar junction transistors release the positive electrostatic current only when the PN junction breaks down. However, the triggering voltage can be reduced if the substrate bias is increased. In this inventions when the ESD protection circuit is applied a positive bias voltage, the substrate triggering circuit will operate to generate the substrate triggering current from the in-terminal to the out-terminal, so that the substrate bias is increased, and the parasitic bipolar junction transistors are generated for releasing the positive electrostatic current.

Figure 3:
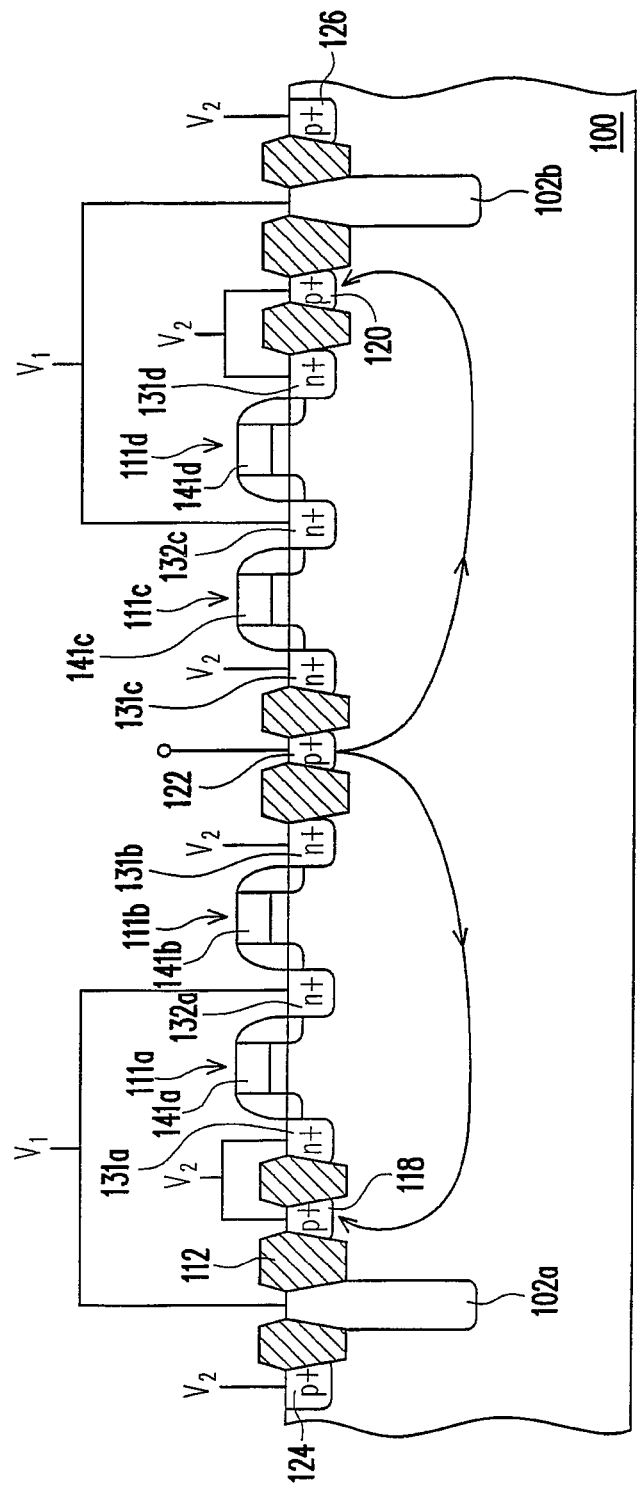
FIG. 3 schematically illustrates an ESD protection circuit according to a second embodiment of the present invention.

FIG. 3 schematically illustrates an ESD protection circuit according to a second embodiment of the present invention.

Referring to FIG. 3, the ESD protection circuit of the second embodiment is similar with that of the first embodiment, and the difference between them will be described in the following. The ESD protection circuit of FIG. 3 includes two first regions 118 and 120 of the first conductivity type, at least one second region 122 of the first conductivity type and at least two transistors, all of which are disposed in the area surrounded by the annular well regions 102a and 102b of the second conductivity type. The at least two transistors includes MOS transistors, bipolar junction transistors (BJT) or field transistors (FT), for example. As shown in FIG. 3, four MOS transistors 111a through 111d of the second conductivity type are exemplified for illustration, without restricting the scope of the present invention.

The two first regions 118 and 120 are disposed in the substrate 100 and surrounded by the annular well regions 102a and 102b. The second region 122 is disposed between the two first regions 118 and 120. The first regions 118 and 120 and the second region 122 are P+ regions, for example. The second region 122 is coupled to the substrate triggering current circuit.

The MOS transistors 111a and 111b are disposed on the substrate 100 between the first region 118 and the second region 122. The MOS transistors 111c and 111d are disposed on the substrate 100 between the first region 120 and the second region 122. The MOS transistors 111a through 111d respectively include sources 131a through 131d and gates 141a through 141d. A drain 132a serves as a common drain for the MOS transistors 111a and 111b. A drain 132c serves as a common drain for the MOS transistors 111c and 111d. The MOS transistors 111c through 111d are NMOS. It should be noted that at least one MOS transistor is disposed between the first region 118 and the second region 122, and at least one MOS transistor is disposed between the first regions 120 and the second region 122. However, the number of the MOS transistors disposed between the first region 118 and the second region 122, and that disposed between the first region 120 and the second region 122 can be same or different. In this embodiment, the ESD protection circuit is illustrated by exemplifying that two MOS transistors are disposed between the first region 118 and the second region 122, and two MOS transistors are disposed between the first region 120 and the second region 122.

In this embodiment, the ESD protection circuit further includes third regions 124 and 126 of the first conductivity type. The third regions are disposed in the substrate 100 at the outside of the annular well regions 102a and 102b. The third regions 124 and 126 are P+ regions, for example. The third regions 124 and 126 can be an annular region as shown in FIG. 1A. In another embodiment (not shown), the third regions 124 and 126 can be two regions disposed at the outside of the annular well regions 102a and 102b. In another embodiment (not shown), only one third region is disposed at one side of the annular well regions 102a and 102b.

It is noted that the ESD protection circuit further includes isolation structures 112 for avoiding the undesired electrical connection. The isolation structures 112 are disposed respectively between the third region 126 and the annular well region 102b, between the annular well region 102b and the first region 120, between the first region 120 and the MOS transistor 111d, between the MOS transistor 111c and the second region 122, between the second region 122 and the MOS transistor 111b, between the MOS transistor 111a and the first region 118, between the first region 118 and the annular well region 102a, and between the annular well region 102a and the third region 124.

Figure 3A:
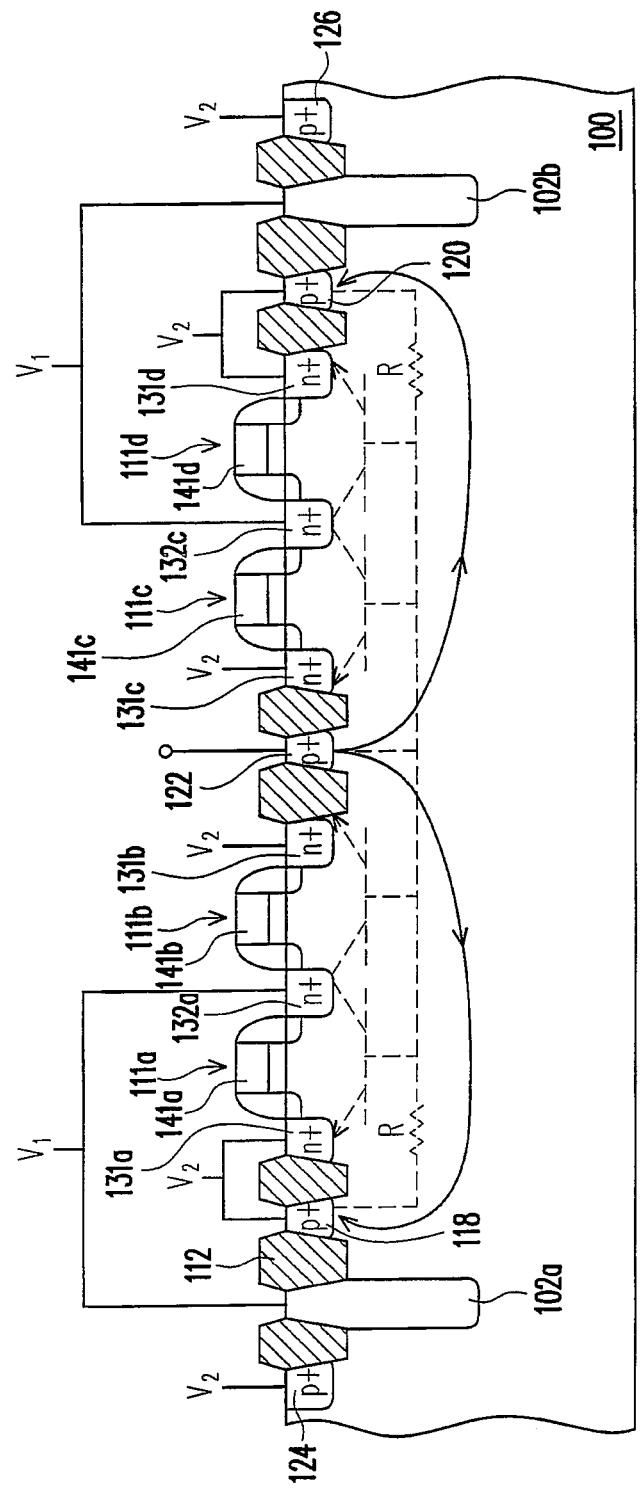
FIG. 3A schematically illustrates an ESD path when an ESD protection circuit is attacked by a positive electrostatic current according to the second embodiment of the present invention.
Figure 3B:
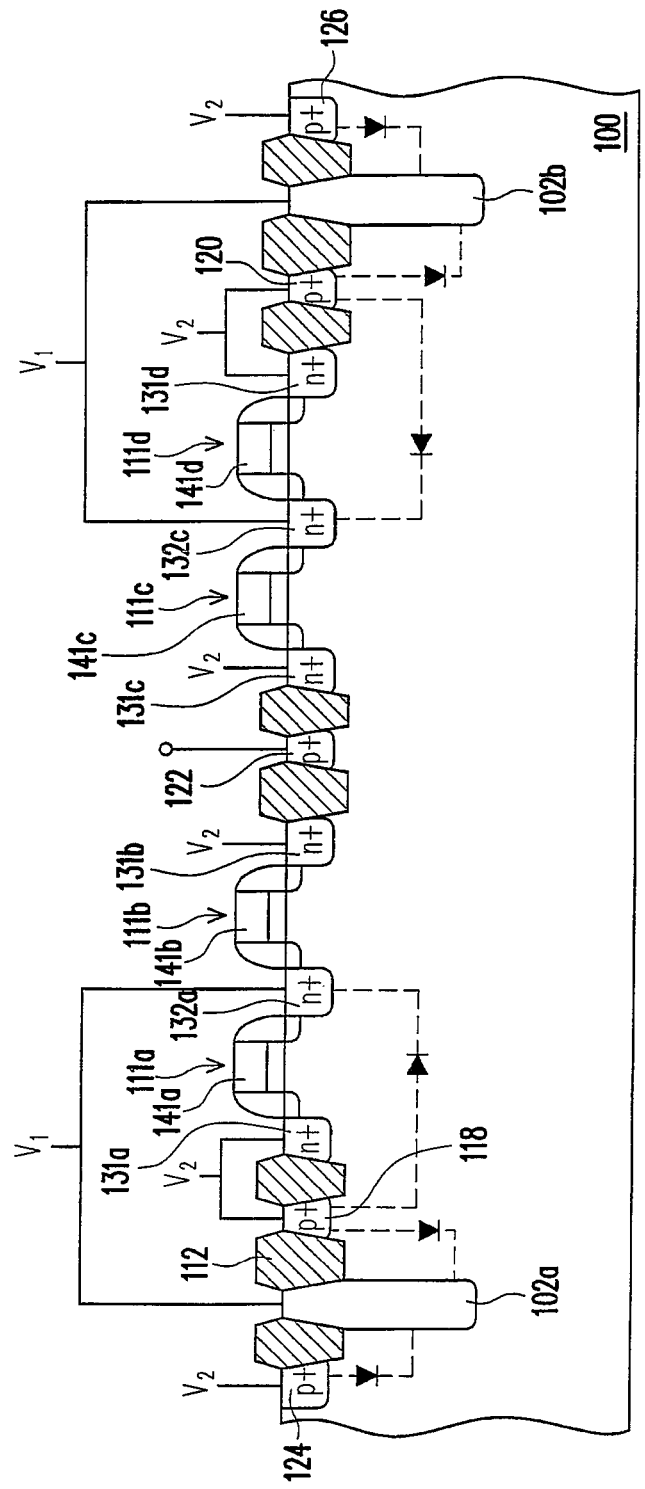
FIG. 3B schematically illustrates an ESD path when an ESD protection circuit is attacked by a negative electrostatic current according to the second embodiment of the present invention.

As shown in FIGS. 3A and 3B, the operation of the ESD protection circuit of the second embodiment is similar with that of the first embodiment, so the details are not provided.

In summary, the present invention provides an ESD protection circuit, in which an annular well region of the second conductivity type is disposed in the substrate of the first conductivity type, so as to restrict the flowing path of the substrate triggering current, and thus the substrate current is increased. Accordingly, the substrate bias is raised, and the incomplete turning on of the transistors of the ESD protection circuit is not observed. In addition, the ESD protection circuit further includes a region of the first conductivity type for releasing a negative electrostatic current, which is disposed in the substrate of the first conductivity type at the outside of the annular well region of the second conductivity type.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An ESD protection circuit, comprising:
a substrate of a first conductivity type;
an annular well region of a second conductivity type, disposed in the substrate;
two first regions of the first conductivity type, disposed in the substrate and surrounded by the annular well region, wherein the first regions are straight, isolated and parallel with each other along a direction, one of the first regions are coupled to a first voltage source, and the other of the first regions is coupled to a substrate triggering circuit; and
at least one transistor, disposed on the substrate between the two first regions and directly contacted with the substrate of the first conductivity type, wherein
the at least one transistor comprises a metal-oxide-semiconductor transistor of the second conductivity type comprising a source, a gate and a drain,
the source is coupled to the first voltage source, and
the annular well region and the drain are coupled to a second voltage source.

2. The ESD protection circuit according to claim 1, wherein the drain forms a diode with the first region coupled to the first voltage source, and the annular well region forms another diode with the first region coupled to the first voltage source.

3. The ESD protection circuit according to claim 1, wherein the drain, the substrate, and the source form a bipolar junction transistor.

4. The ESD protection circuit according to claim 1, wherein the first conductivity type is P-type, and the second conductivity type is N-type.

5. The ESD protection circuit according to claim 1, wherein the first conductivity type is N-type, and the second conductivity type is P-type.

6. The ESD protection circuit according to claim 1, further comprising an isolation structure, disposed between the annular well region and each of the first regions, and between each of the first regions and the transistor.

7. The ESD protection circuit according to claim 1, further comprising a second region of the first conductivity type, disposed in the substrate at an outside of the annular well region.

8. The ESD protection circuit according to claim 7, wherein the second region and the annular well region form a diode.

9. An ESD protection circuit, comprising:
a substrate of a first conductivity type;
an annular well region of a second conductivity type, disposed in the substrate;
two first regions of the first conductivity type, disposed in the substrate and surrounded by the annular well region, wherein the first regions are straight, isolated and parallel with each other along a direction;
at least one second region of the first conductivity type, disposed between the two first regions, wherein the at least one second region is coupled to a substrate triggering circuit; and
at least two transistors, disposed on and directly contacted with the substrate of the first conductivity type, wherein the transistors are respectively between one of the first regions and the second region and between the other of the first regions and the second region, wherein
the at least two transistors comprise metal-oxide-semiconductor transistors of the second conductivity type and each of the metal-oxide-semiconductor transistors comprises a source, a gate, and a drain,
the drain and the annular well region are coupled to a first voltage source, and
the source and the two first regions are coupled to a second voltage source.

10. The ESD protection circuit according to claim 9, wherein the drain, the substrate, and the source adjacent to the drain form a bipolar junction transistor.

11. The ESD protection circuit according to claim 9, wherein one of the first regions form diodes respectively with the annular well region and the adjacent drain, and the other of the first regions form diodes respectively with the annular well region and the other of the drains.

12. The ESD protection circuit according to claim 9, wherein the first conductivity type is P-type, and the second conductivity type is N-type.

13. The ESD protection circuit according to claim 9, wherein the first conductivity type is N-type, and the second conductivity type is P-type.

14. The ESD protection circuit according to claim 9, further comprising an isolation structure, disposed between the annular well region and each of the two first regions, between each of the two first regions and each of the two transistors, and between the second region and each of the two transistors.

15. The ESD protection circuit according to claim 9, further comprising a third region of the first conductivity type, disposed in the substrate at an outside of the annular well region.

16. The ESD protection circuit according to claim 15, wherein the third region and the annular well region form a diode.

* * * * *